US008653454B2

(12) United States Patent
Chen et al.

(10) Patent No.: US 8,653,454 B2
(45) Date of Patent: Feb. 18, 2014

(54) ELECTRON-BEAM IMAGE RECONSTRUCTION

(75) Inventors: Dongxue Chen, Palo Alto, CA (US); Changqing Hu, Sunnyvale, CA (US); Linyong Pang, Los Gatos, CA (US)

(73) Assignee: Luminescent Technologies, Inc., Palo Alto, CA (US)

( * ) Notice: Subject to any disclaimer, the term of this patent is extended or adjusted under 35 U.S.C. 154(b) by 251 days.

(21) Appl. No.: 13/182,219

(22) Filed: Jul. 13, 2011

(65) Prior Publication Data

US 2013/0015350 A1  Jan. 17, 2013

(51) Int. Cl.
*G01N 23/00* (2006.01)

(52) U.S. Cl.
USPC .......................................... 250/306; 250/307

(58) Field of Classification Search
USPC .................... 250/306, 307, 310, 311
See application file for complete search history.

(56) References Cited

U.S. PATENT DOCUMENTS

| | | | |
|---|---|---|---|
| 5,315,700 A | 5/1994 | Johnston et al. |
| 5,488,418 A | 1/1996 | Mishima et al. |
| 5,710,561 A | 1/1998 | Schmidt et al. |
| 6,047,116 A | 4/2000 | Murakami et al. |
| 6,225,025 B1 | 5/2001 | Hoshino |
| 6,261,728 B1 | 7/2001 | Lin |
| 6,285,488 B1 | 9/2001 | Sandstrom |
| 6,428,940 B1 | 8/2002 | Sandstrom |
| 6,438,199 B1 | 8/2002 | Schultz et al. |
| 6,480,285 B1 | 11/2002 | Hill |
| 6,484,306 B1 | 11/2002 | Bokor et al. |
| 6,504,644 B1 | 1/2003 | Sandstrom |
| 6,563,566 B2 | 5/2003 | Rosenbluth et al. |
| 6,709,792 B2 | 3/2004 | Nako |
| 6,871,337 B2 | 3/2005 | Socha |
| 6,873,720 B2 | 3/2005 | Cai et al. |

(Continued)

FOREIGN PATENT DOCUMENTS

| | | |
|---|---|---|
| DE | 102007 028172 B3 | 11/2008 |
| JP | 2009 010373 | 1/2009 |
| WO | WO 2005/078528 A2 | 8/2005 |
| WO | WO 2005/078528 A3 | 8/2005 |

OTHER PUBLICATIONS

Magoshi et al., "High-Speed Electron Beam Data Conversion System Combining Hierarchical Operation with Parallel Processing", Japanese Journal of Applied Physics, vol. 31, No. 12B, Part 1, Dec. 1992, pp. 4257-4261.

(Continued)

*Primary Examiner* — Robert Kim
*Assistant Examiner* — Hanway Chang
(74) *Attorney, Agent, or Firm* — Wilson Sonsini Goodrich & Rosati (57) ABSTRACT

A technique for reconstructing an electron-beam (EB) image, which can be a scanning-electron-microscope (SEM) image or an EB-inspection image, is described. This reconstruction technique may involve an inverse electro-optical calculation that corrects for the influence of an electro-optical transfer function associated with an EB system on the EB image. In particular, in the inverse calculation a multi-valued representation of an initial EB image is at an image plane in the model of the electro-optical transfer function and a resulting EB image is at an object plane in the model of the electro-optical transfer function. Furthermore, the model of the electro-optical transfer function may have an analytical derivative and/or may be represented by a closed-form expression.

20 Claims, 9 Drawing Sheets

(56) References Cited

U.S. PATENT DOCUMENTS

| | | |
|---|---|---|
| 6,925,202 B2 | 8/2005 | Karklin et al. |
| 7,003,755 B2 | 2/2006 | Pang et al. |
| 7,043,071 B2 | 5/2006 | Qian et al. |
| 7,057,709 B2 | 6/2006 | Rosenbluth |
| 7,093,226 B2 | 8/2006 | Pang |
| 7,093,229 B2 | 8/2006 | Pang et al. |
| 7,107,573 B2 | 9/2006 | Yamazoe et al. |
| 7,124,394 B1 | 10/2006 | Abrams et al. |
| 7,152,219 B2 | 12/2006 | Pang |
| 7,178,127 B2 | 2/2007 | Abrams et al. |
| 7,231,628 B2 | 6/2007 | Pack et al. |
| 7,254,251 B2 | 8/2007 | Cai et al. |
| 7,302,090 B2 | 11/2007 | Kalus et al. |
| 7,363,611 B2 | 4/2008 | Rosenbluth |
| 7,376,512 B2 | 5/2008 | Hirscher et al. |
| 7,384,710 B2 | 6/2008 | Ogawa et al. |
| 7,403,649 B2 | 7/2008 | Cai et al. |
| 7,441,227 B2 | 10/2008 | Abrams et al. |
| 7,480,889 B2 | 1/2009 | Abrams et al. |
| 7,483,559 B2 | 1/2009 | Luk-Pat et al. |
| 7,557,921 B1 | 7/2009 | Adel et al. |
| 7,565,001 B2 | 7/2009 | Cai et al. |
| 7,571,423 B2 | 8/2009 | Abrams et al. |
| 7,617,474 B2 | 11/2009 | Pang et al. |
| 7,618,751 B2 | 11/2009 | Sandstrom et al. |
| 7,646,906 B2 | 1/2010 | Saidin et al. |
| 7,676,077 B2 | 3/2010 | Kulkarni et al. |
| 7,689,966 B2 | 3/2010 | Verma et al. |
| 7,695,876 B2 | 4/2010 | Ye et al. |
| 7,698,665 B2 | 4/2010 | Abrams et al. |
| 7,703,049 B2 | 4/2010 | Abrams et al. |
| 7,703,068 B2 | 4/2010 | Abrams et al. |
| 7,707,541 B2 | 4/2010 | Abrams et al. |
| 7,749,666 B2 | 7/2010 | Gassner et al. |
| 7,757,201 B2 | 7/2010 | Abrams et al. |
| 7,769,225 B2 | 8/2010 | Kekare et al. |
| 7,805,700 B2 | 9/2010 | Peng |
| 7,853,920 B2 | 12/2010 | Preil et al. |
| 7,921,383 B1 | 4/2011 | Wei |
| 7,984,391 B2 | 7/2011 | Abrams et al. |
| 7,992,109 B2 | 8/2011 | Abrams et al. |
| 7,995,832 B2 | 8/2011 | Xiong et al. |
| 8,056,021 B2 | 11/2011 | Abrams et al. |
| 8,057,967 B2 | 11/2011 | Ye et al. |
| 8,111,380 B2 | 2/2012 | Abrams et al. |
| 8,142,958 B2 | 3/2012 | Holfeld |
| 8,200,002 B2 | 6/2012 | Preil et al. |
| 8,204,295 B2 | 6/2012 | Preil et al. |
| 8,208,712 B2 | 6/2012 | Preil et al. |
| 8,214,775 B2 | 7/2012 | Gergov et al. |
| 8,245,162 B2 | 8/2012 | Abrams et al. |
| 8,260,032 B2 | 9/2012 | Preil et al. |
| 8,280,146 B2 | 10/2012 | Preil et al. |
| 8,285,030 B2 | 10/2012 | Zhou et al. |
| 8,331,645 B2 | 12/2012 | Preil et al. |
| 8,386,968 B2 | 2/2013 | Pang |
| 8,458,622 B2 | 6/2013 | Pang et al. |
| 8,463,016 B2 | 6/2013 | Pang |
| 2002/0171816 A1 | 11/2002 | Markle |
| 2002/0192578 A1 | 12/2002 | Tanaka et al. |
| 2003/0061587 A1 | 3/2003 | Zhang et al. |
| 2003/0103189 A1 | 6/2003 | Neureuther et al. |
| 2003/0106642 A1 | 6/2003 | Fairbairn et al. |
| 2003/0123040 A1 | 7/2003 | Almogy |
| 2003/0184809 A1 | 10/2003 | Clouthier et al. |
| 2004/0075882 A1 | 4/2004 | Meisburger |
| 2004/0130561 A1 | 7/2004 | Jain |
| 2004/0265707 A1 | 12/2004 | Socha |
| 2005/0068613 A1 | 3/2005 | McGeoch |
| 2005/0122500 A1 | 6/2005 | Ye et al. |
| 2005/0168498 A1 | 8/2005 | Granik |
| 2006/0033902 A1 | 2/2006 | Latypov et al. |
| 2006/0038125 A1* | 2/2006 | Tsuneta et al. ............... 250/310 |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0087635 A1 | 4/2006 | Kazumi et al. |
| 2006/0098181 A1 | 5/2006 | Case et al. |
| 2006/0269116 A1 | 11/2006 | Makarovic et al. |
| 2006/0273242 A1 | 12/2006 | Hunsche et al. |
| 2007/0045572 A1 | 3/2007 | Kessels et al. |
| 2007/0105029 A1 | 5/2007 | Ausschnitt |
| 2007/0133862 A1 | 6/2007 | Gold et al. |
| 2007/0198963 A1 | 8/2007 | Granik et al. |
| 2008/0152212 A1 | 6/2008 | Feldman |
| 2008/0170774 A1 | 7/2008 | Xiong et al. |
| 2008/0198350 A1 | 8/2008 | Sugita et al. |
| 2008/0241708 A1 | 10/2008 | Lin et al. |
| 2009/0073413 A1 | 3/2009 | Abrams et al. |
| 2009/0077526 A1 | 3/2009 | Abrams et al. |
| 2009/0077527 A1 | 3/2009 | Gergov et al. |
| 2011/0022994 A1 | 1/2011 | Hu et al. |
| 2011/0194752 A1 | 8/2011 | Pang |
| 2011/0229805 A1 | 9/2011 | Wang et al. |
| 2012/0066651 A1 | 3/2012 | Pang et al. |
| 2012/0066652 A1 | 3/2012 | Clifford |
| 2012/0134542 A1 | 5/2012 | Pang et al. |
| 2012/0137260 A1 | 5/2012 | Pang et al. |
| 2012/0189187 A9 | 7/2012 | Preil et al. |

OTHER PUBLICATIONS

Chen, C. Y. et al, "Mask defect auto disposition based on aerial image in mask product", Proc. SPIE 7379, 73791F (2009).

Notice of Allowance issued by USPTO, mailed May 31, 2013, in Clifford, C., U.S. Appl. No. 13/021,591, "Technique for Analyzing a Reflective Photo-Mask" filed Feb. 4, 2011.

Comments on Statement for Reasons for Allowance filed Aug. 30, 2013, in Clifford, C., U.S. Appl. No. 13/021,591, "Technique for Analyzing a Reflective Photo-Mask" filed Feb. 4, 2011.

Office Action issued by USPTO, mailed Apr. 5, 2013, in Pang, L. et al., U.S. Appl. No. 13/024,233, "Technique for Repairing a Reflective Photo-Mask," filed Feb. 9, 2011.

Response to Office Action filed Jun. 26, 2013, in Pang, L. et al., U.S. Appl. No. 13/024,233, "Technique for Repairing a Reflective Photo-Mask," filed Feb. 9, 2011.

Notice of Allowance issued by USPTO, mailed Aug. 2, 2013, Pang, L. et al., U.S. Appl. No. 13/024,233, "Technique for Repairing a Reflective Photo-Mask," filed Feb. 9, 2011.

Written Opinion issued by USPTO, mailed Mar. 25, 2008, in Luminescent Technologies, Inc. International Application No. PCT/US07/078913, "Photo-Mask and Wafer Image Reconstruction" filed Sep. 19, 2007.

Response to Written Opinion filed Jul. 17, 2008, in Luminescent Technologies, Inc. International Application No. PCT/US07/078913, "Photo-Mask and Wafer Image Reconstruction" filed Sep. 19, 2007.

Pang et al., "Considering MEEF in Inverse Lithography Technology (ILT) and Source Mask Optimization (SMO)" SPIE, vol. 7122, 14 pgs., (Oct. 17, 2008).

Pang, L., et al. "Full Chip Scale Source Mask Optimization (SMO) Implemented through Level Set Methods based Inverse Lithography Technology (ILT) Framework," Luminescent Litho Workshop 2009 Abstract, Apr. 29, 2009 vJM1.

Rosenbluth et al., "Optimum Mask and Source Patterns to Print Given Shape", Apr. 2002, SPIE Proceedings vol. 4346, pp. 13-30.

Satake, et al., "Technique, for Repairing a Reflective Photo-Mask," U.S. Appl. No. 13/764,517, filed Feb. 11, 2013.

Xiao et al., "Source Optimization and Mask Design to Minimize MEEF in Low $k_1$ Lithography" SPIE, vol. 7028, 11 pgs., (Jun. 9, 2008).

* cited by examiner

ELECTRON-BEAM IMAGE RECONSTRUCTION

BACKGROUND OF THE INVENTION

1. Field of the Invention

The present invention relates to techniques for reconstructing electron-beam (EB) images. More specifically, the invention relates to a technique for reconstructing an EB image using an inverse electro-optical calculation that corrects for an electro-optical transfer function.

2. Related Art

Electron beams (EBs) are widely used in micro-analysis and inspection. For example, an EB in a scanning electron microscope (SEM) may be used to measure a contour of a photo-mask or a wafer pattern with high spatial resolution. Typically, the resulting SEM image (which is more generally referred to as an 'electron-beam image' or an 'EB image') is often noisy or has a low signal-to-noise ratio (SNR) because a low beam current or rapid scanning is typically used to avoid damaging the photo-mask or the wafer. Alternatively, an EB in an EB-inspection device may result in an EB image with high SNR but lower spatial resolution than in an SEM.

However, in either of these applications, the resulting EB image corresponds to a convolution of the electro-optical transfer function of the measuring device (such as the SEM or the EB-inspection device) and the object being imaged or inspected (such as a photo-mask or a wafer). This additional contribution can degrade the quality of the results obtained using SEM imaging or EB inspection. In particular, in SEM imaging the electro-optical transfer function can increase the noise in the measured EB image, while in EB inspection the electro-optical transfer function can distort the measured EB image.

Hence, what is needed is a technique for reconstructing EB images that overcomes the problems listed above.

SUMMARY OF THE INVENTION

The present disclosure relates to a computer system for calculating an image. During operation, the computer system receives a first electron-beam (EB) image of a pattern, where the first EB image is associated with an EB system. Then, the computer system generates a multi-valued representation of the first EB image. Moreover, the computer system calculates a second EB image based on the multi-valued representation of the first EB image and a model of an electro-optical transfer function associated with the EB system, where the second EB image is calculated using an inverse calculation in which the multi-valued representation of the first EB image is at an image plane in the model of the electro-optical transfer function and the second EB image is at an object plane in the model of the electro-optical transfer function.

Note that the multi-valued representation of the first EB image includes a level-set function. Moreover, the pattern may include a photo-mask and/or a wafer pattern.

Furthermore, the inverse calculation may deconvolve the electro-optical transfer function from the multi-valued representation of the first EB image, thereby filtering noise.

Additionally, the model of the electro-optical transfer function may have an analytical derivative and/or may be represented by a closed-form expression. For example, the model of the electro-optical transfer function may correspond to: an EB-size distribution, a secondary-electron bulk-generation distribution, a distribution associated with shadowing effects in the pattern, a background EB intensity and a foreground EB intensity. In some embodiments, the model of the electro-optical transfer function corresponds to an overshoot amplitude and an undershoot amplitude.

Note that the pattern may correspond to a target pattern, and the second EB image may be based on the target pattern.

In some embodiments, the computer system rendering a third EB image is based on the second EB image. Furthermore, in some embodiments the computer system identifies a feature in the second EB image, such as a critical dimension in the pattern. For example, when the pattern corresponds to the target pattern, the feature may correspond to a difference between the pattern and the target pattern. In some embodiments, the computer system determines an acceptance condition of the pattern in accordance with the feature.

Another embodiment provides a method including at least some of the above-described operations.

Another embodiment provides a computer-program product for use in conjunction with the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

Note that like reference numerals refer to corresponding parts throughout the drawings. Moreover, multiple instances of the same part are designated by a common prefix separated from an instance number by a dash.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These devices and processes may be used to reconstruct an electron-beam (EB) image, which can be a scanning-electron-microscope (SEM) image or an EB-inspection image. This reconstruction may involve an inverse electro-optical calculation that corrects for the influence of an electro-optical transfer function associated with an EB system on the EB image. In particular, in the inverse calculation a multi-valued representation of an initial EB image is at an image plane in the model of the electro-optical transfer function and a resulting EB image is at an object plane in the model of the electro-optical transfer function. Furthermore, the model of the electro-optical transfer function may have an analytical derivative and/or may be represented by a closed-form expression.

This reconstruction technique may provide a fast and accurate approach for implementing a noise-reduction filter, thereby improving EB-image quality and the accuracy of contours or information extracted from the resulting reconstructed EB image. Therefore, the reconstruction technique may improve the usefulness of EB images in micro-analysis and inspection. For example, the reconstruction technique may improve EB images of photo-masks and wafer patterns, thereby improving the inspection of these patterns, with a commensurate impact on yield and cost.

In the discussion that follows, photo-masks should be understood to include: reflective photo-masks for use in extreme ultra-violet photolithography, chromium-on-glass photo-masks, alternating phase-shifting photo-masks, attenuating phase-shifting photo-masks, and/or multiple-exposure photo-masks (i.e., where patterns printed using two or more photo-masks are combined to produce a desired pattern). In addition, in the discussion that follows note that a mask pattern or a target pattern may include a bitmap or grayscale file that includes a set of values corresponding to pixels in the mask pattern or the target pattern. Furthermore, the quantization (i.e., the number of bits) in these files may be varied, as needed, during the calculations that are described. Alternative formats having the same or similar information content, including a vector-based format such as a Graphic Design System II (GDSII) and/or an OASIS format, may be used in some embodiments of the mask pattern or the target pattern. In some embodiments, the mask pattern or the target pattern include real and imaginary components (or equivalently, magnitude and phase information).

Figure 1:
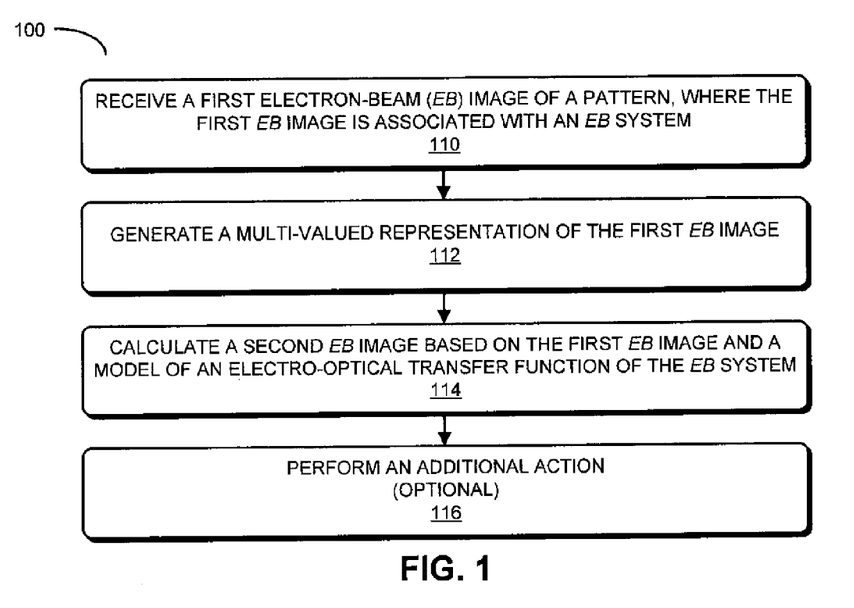
FIG. 1 is a flow chart illustrating a method for calculating an image in accordance with an embodiment of the present invention.

We now describe embodiments of the reconstruction technique. FIG. 1 presents a flow chart illustrating a method 100 for calculating an image, which is performed by a computer system (such as computer system 600 in FIG. 6). During operation, the computer system receives a first EB image of a pattern (operation 110), where the first EB image is associated with an EB system. Note that the pattern may include a photo-mask and/or a wafer pattern.

Then, the computer system generates a multi-valued representation of the first EB image (operation 112), such as a level-set function.

Moreover, the computer system calculates a second EB image based on the multi-valued representation of the first EB image and a model of an electro-optical transfer function associated with the EB system (operation 114), where the second EB image is calculated using an inverse calculation in which the multi-valued representation of the first EB image is at an image plane in the model of the electro-optical transfer function and the second EB image is at an object plane in the model of the electro-optical transfer function. For example, the inverse calculation may deconvolve the electro-optical transfer function from the multi-valued representation of the first EB image, thereby filtering noise.

Note that the model of the electro-optical transfer function may have an analytical derivative and/or may be represented by a closed-form expression. For example, the model of the electro-optical transfer function may correspond to: an EB-size distribution, a secondary-electron bulk-generation distribution, a distribution associated with shadowing effects in the pattern, a background EB intensity and a foreground EB intensity. In some embodiments, the model of the electro-optical transfer function corresponds to an overshoot amplitude and an undershoot amplitude.

Furthermore, in some embodiments the pattern corresponds to a target pattern (such as a target mask pattern or a target wafer pattern), and the second EB image may be based on the target pattern.

In some embodiments, after calculating the second EB image the computer system optionally performs an additional action (operation 116). For example, the computer system may render a third EB image (such as an SEM image) based on the second EB image.

Alternatively or additionally, the computer system may identify a feature in the second EB image, such as a critical dimension in the pattern. For example, when the pattern corresponds to the target pattern, the feature may correspond to a difference between the pattern and the target pattern.

In some embodiments, during the additional action the computer system determines an acceptance condition of the pattern in accordance with the feature.

In some embodiments of method 100 there may be additional or fewer operations. Moreover, the order of the operations may be changed, and/or two or more operations may be combined into a single operation.

In an exemplary embodiment, the reconstruction technique is used to deconvolve an electro-optical transfer function associated with an EB system (such as a SEM or an EB-inspection system) from an EB image (such as a SEM image or an EB-inspection image). In particular, the EB image may be represented using a level-set function (and, more generally, a multi-valued function), and an inverse electro-optical calculation may be used to deconvolve the model of the electro-optical transfer function. In this way, edges may be restored in an EB-inspection image or, effectively, a noise-reduction filter may be implemented to obtain better SEM image quality and to extract an SEM contour (such as a mask pattern or a wafer pattern).

Figure 2:
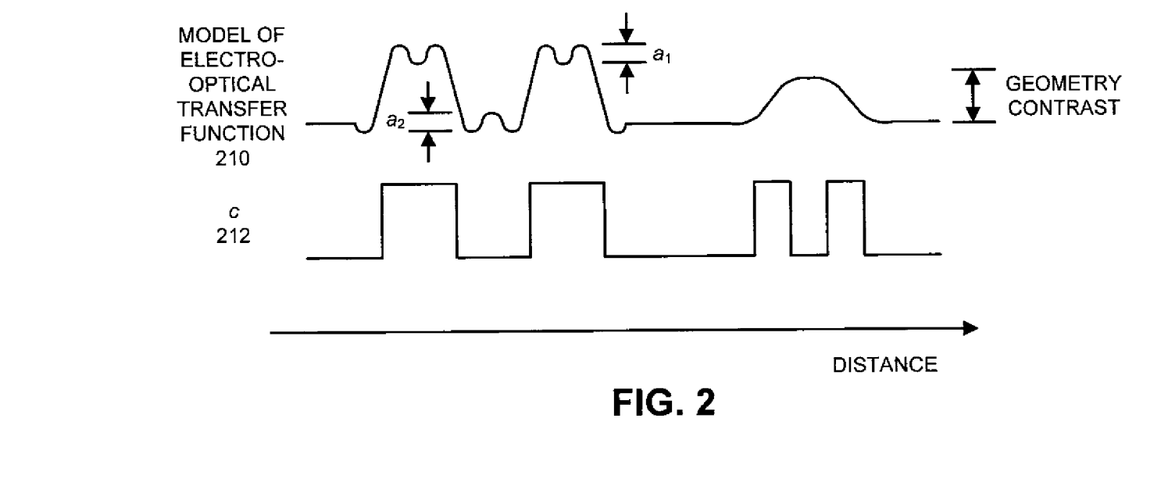
FIG. 2 is a drawing of a model of an electro-optical transfer function in accordance with an embodiment of the present invention.

FIG. 2 presents a drawing a model of an electro-optical transfer function 210. This model of the electro-optical transfer function may correspond to: an EB-size distribution $g_3$ (with a standard deviation of approximately 5-10 nm), a secondary-electron bulk-generation distribution $g_1$ (with a standard deviation of approximately 50 nm), a distribution associated with shadowing effects in the pattern $g_2$ (with a standard deviation of approximately 20 nm), a background EB intensity b (if the surface is fully covered with another material than the substrate) and a foreground EB intensity f. In some embodiments, the model of the electro-optical transfer function corresponds to an overshoot amplitude $a_1$ (which is associated with enhanced secondary electron escape) and an undershoot amplitude $a_2$ (which is associated with blocking of secondary electron escape). In particular, for a chrome-on-glass photo-mask with a mask-pattern contour c 212, model of the electro-optical transfer function 210 may be represented as $$g_3 \otimes [a_1 \cdot c \cdot g_1 \otimes (1-c) + a_2 \cdot c \cdot (1-c) \cdot g_2 \otimes c + b \cdot c + f \cdot (1-c)],$$

where $\otimes$ is a convolution operation. Note that this model is, approximately, a derivative of a sinx function with low-pass filtering. Furthermore, note that, in order for the model of the electro-optical transfer function to be used in the inverse electro-optical calculation, the analytical derivative of the model of the electro-optical transfer function may need to be defined.

Figure 3A:
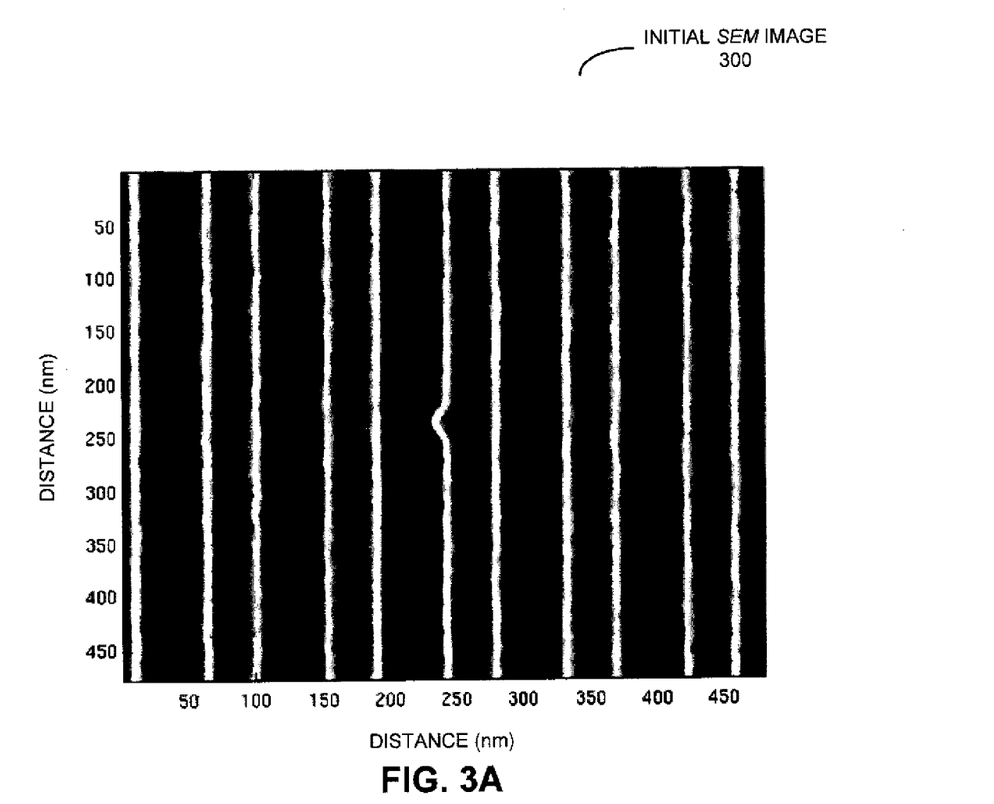
FIG. 3A is a drawing of an initial scanning-electron-microscope (SEM) image in accordance with an embodiment of the present invention.
Figure 3B:
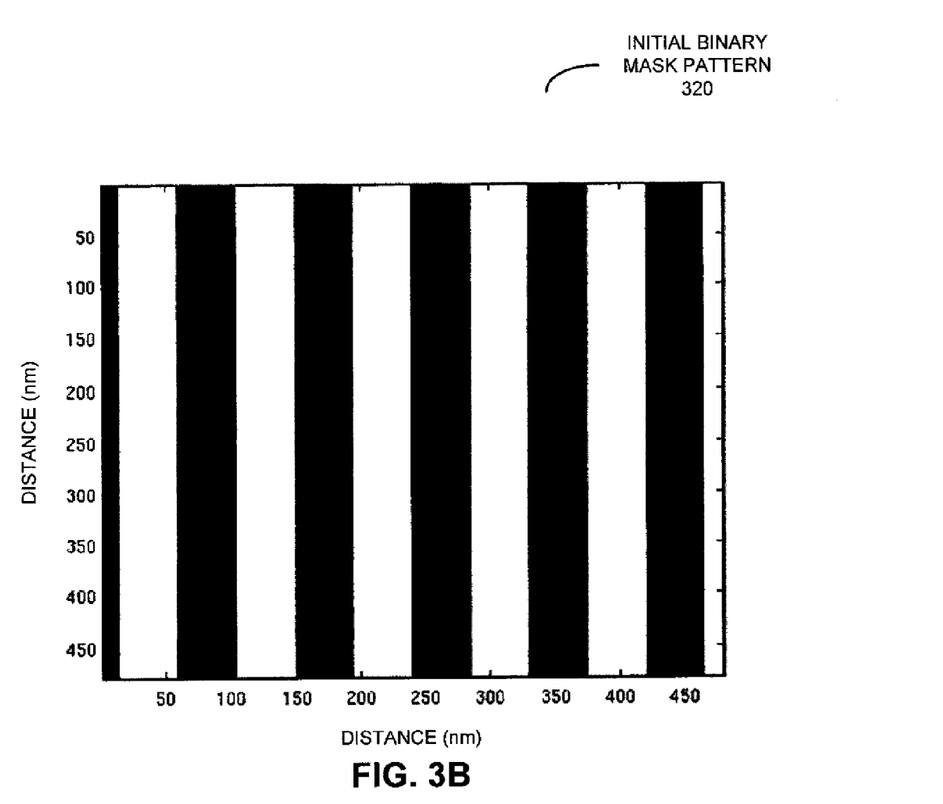
FIG. 3B is a drawing of an initial binary mask pattern determined from the initial SEM image of FIG. 3A in accordance with an embodiment of the present invention.
Figure 3C:
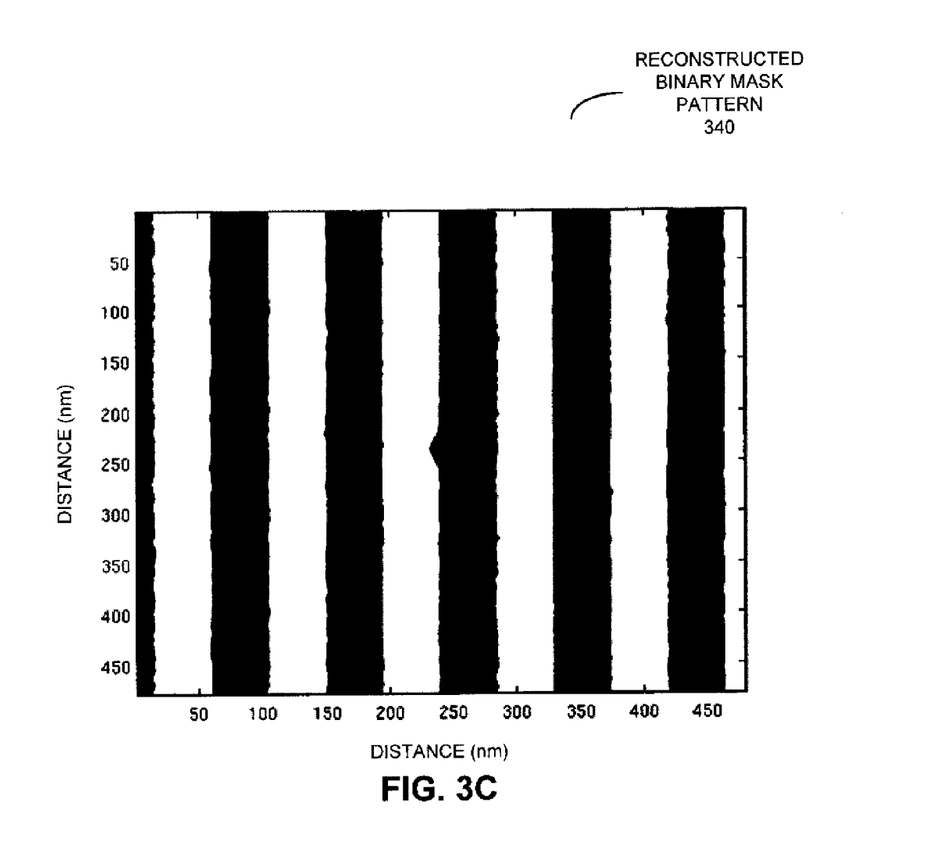
FIG. 3C is a drawing of a reconstructed binary mask pattern based on the initial binary mask pattern of FIG. 3B in accordance with an embodiment of the present invention.
Figure 3D:
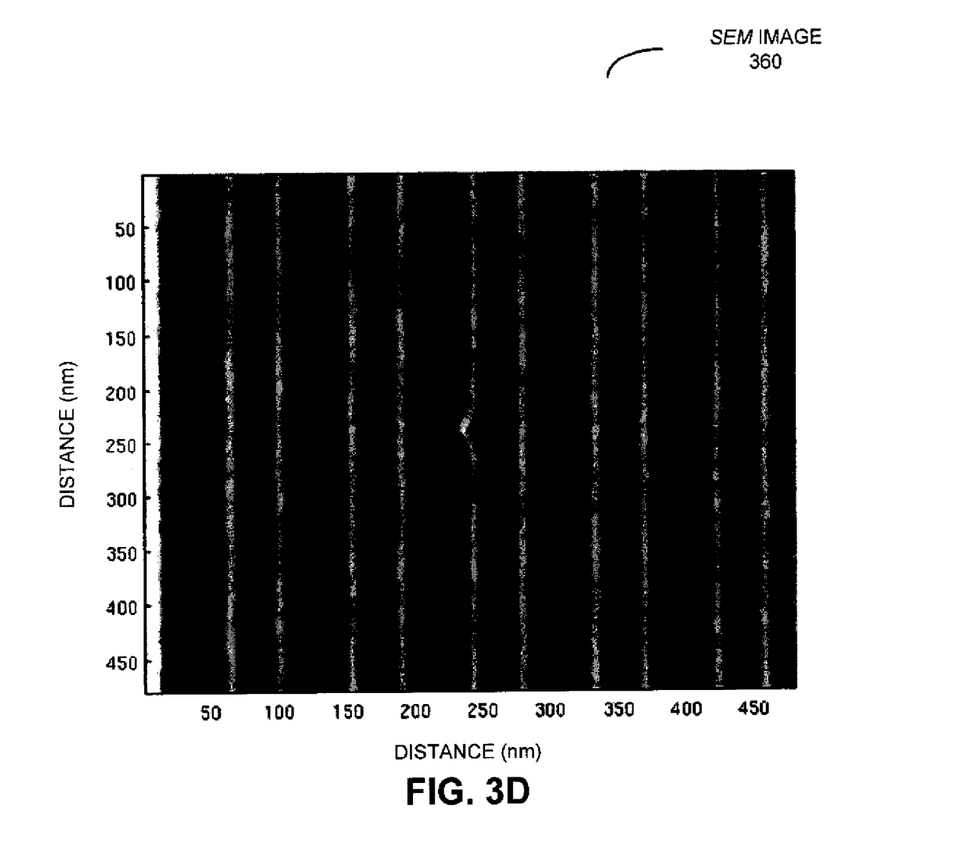
FIG. 3D is a drawing of a rendered SEM image based on the reconstructed binary mask pattern of FIG. 3C in accordance with an embodiment of the present invention.

FIG. 3A presents a drawing of an initial SEM image 300. As shown in FIG. 3B, an initial binary mask pattern 320 may be determined from initial SEM image 300 (FIG. 3A). After the deconvolving the model of the electro-optical transfer function in an inverse electro-optical calculation, reconstructed binary mask pattern 340 in FIG. 3C may be obtained from initial binary mask pattern 320 (FIG. 3B). As shown in FIG. 3D, using this reconstructed binary mask pattern, an SEM image 360 may be rendered.

In this example, there are 640 image pixels along the x direction, and 640 image pixels along they direction in SEM image 300 (FIG. 3A). This corresponds to physical dimensions of 1912×1912 nm². In the model of the electro-optical transfer function for this example, b, which represents the quartz intensity for a clear region on the photo-mask, equals 101.606. This is a low intensity because of the low atomic number. Furthermore, f equals 123.742, $g_3$ equals 11.60326, $a_1$ equals 2.74477, $a_2$ equals 1.47, $g_1$ equals 12.52316 (which determines how fast overshoot fades as the EB moves away from the mask-pattern edge), and $g_2$ equals 7.79846 (which determines how fast shadowing fades as the EB moves away from foothill).

Figure 4:
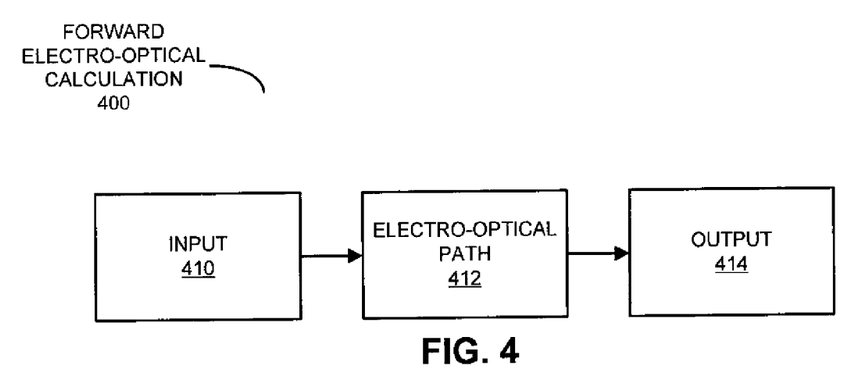
FIG. 4 is a block diagram illustrating a forward electro-optical calculation in accordance with an embodiment of the present invention.

We now describe forward and inverse optical calculations. FIG. 4 presents a block diagram illustrating a forward electro-optical calculation 400. In this calculation, an EB image (such as an EB image in an EB system) is used as an input 410 at an object plane of electro-optical path 412 to determine a predicted output 414 (such as another EB image) at an image plane of electro-optical path 412. For example, using the calculated secondary electrons from a photo-mask (which is illuminated by an EB) and the model of the electro-optical transfer function associated with electro-optical path 412, an EB image can be determined.

Figure 5:
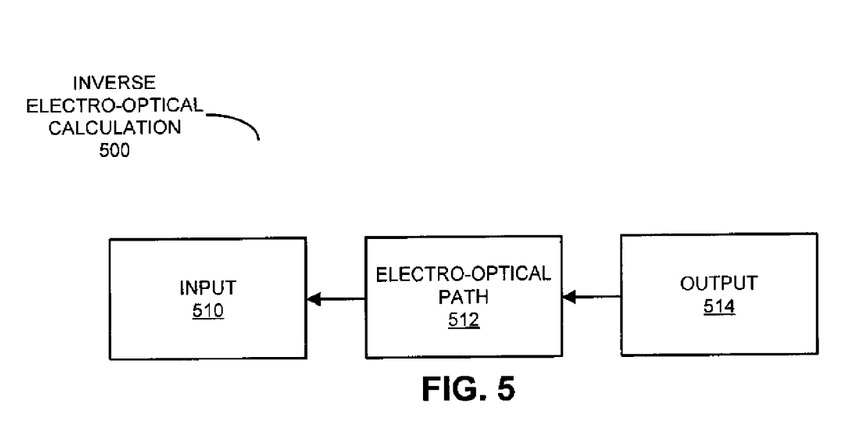
FIG. 5 is a block diagram illustrating an inverse electro-optical calculation in accordance with an embodiment of the present invention.

FIG. 5 presents a block diagram illustrating an inverse electro-optical calculation 500. In this calculation, a predicted input 510 (such as a predicted EB image) at an object plane of electro-optical path 512 is determined based on an output 514 (such as an EB image) at an image plane of electro-optical path 512. For example, a deconvolved EB image may be determined from an initial EB image using the model of the electro-optical transfer function.

While the preceding discussion illustrates the inverse electro-optical calculation using a single output 514, in other embodiments multiple EB images at image plane(s) of electro-optical path 512 may be used. For example, instead of the initial EB image, there may be a set of EB images that are each determined using different wavelengths, different focal conditions (e.g., on different focal surfaces or planes), and/or different imaging conditions in the EB system. These EB images may include magnitude and/or phase information. Furthermore, in some embodiments each of the EB images at the image plane(s) used in the inverse electro-optical calculation 500 or a term(s) including some combination of the EB images at the image plane(s) may be multiplied by a corresponding weight. In this way, inverse electro-optical calculation 500 may emphasize one or more of the EB images at the image plane relative to other EB images (at the same or other image planes) used in inverse electro-optical calculation 500.

In some embodiments, inverse electro-optical calculation 500 is based on iterative minimization of a cost function (H), which is also sometimes referred to as an 'error function' or a 'Hamiltonian function.' In particular, during each iteration of inverse electro-optical calculation 500 the cost function may be a function of the difference between output 514 and an EB image that results when input 510 is projected through electro-optical path 512. In some embodiments, input 510 initially corresponds to the target pattern (such as a mask pattern or a wafer pattern), and as the calculation progresses this pattern is allowed to evolve while output 514 is held constant (subject to the constraints that there are a finite number of discrete steps sizes or pixel sizes).

In embodiments with multiple EB images at object plane(s) and/or image plane(s), the cost function (H) equals $$\sum_{j=1}^{N} w_j |I_j - I_{oj}|^n,$$

where $I_j$ is the forward projection of the jth modified EB image at the object plane (out of N EB images in this example) through electro-optical path 512, $w_j$ is a corresponding weight, $I_{oj}$ is the jth initial EB image at an image plane, and n is a power. (Alternatively, initially in inverse electro-optical calculation 500, $I_{oj}$ is the forward projection of the jth target pattern at the object plane.) Note that the cost function (H) approaches zero as $I_j$ approaches $I_{oj}$.

In an exemplary embodiment, N is 3 and n is 2. Three initial EB images at the image plane(s) may be determined at three different focal conditions (or focus settings) in the EB system. Alternatively or in addition, the three EB images at the image plane(s) may be determined at three different wavelengths or imaging conditions. Furthermore, a corresponding set of weights $\{w_j\}$ may be 1, 0.1, and 1.

In other embodiments, the weights are varied as inverse electro-optical calculation 500 progresses and/or different weights are used for specific parts (or even pixels) of an EB image. For example, the weights may be determined based on the difference between $I_j$ and $I_{oj}$ at a given step or iteration in inverse electro-optical calculation 500. This approach may exaggerate the features or defects, especially when inverse electro-optical calculation 500 is close to a local or global minimum and the cost function (H) corresponds to small differences. Thus, in general the cost function (H) may be expressed as a double integral over the EB image area and there may be separate time-dependent weights for $I_j$ and $I_{oj}$. Furthermore, in some embodiments the cost function (H) is expressed as a relative difference between $I_j$ and $I_{oj}$ for at least a portion of inverse electro-optical calculation 500 as it progresses.

It will be recognized by one of ordinary skill in the art that inverse electro-optical calculation 500 described above is poorly defined. In particular, numerous possible EB images at the object plane may result from the same observed output 514. Therefore, input 510 may be selected such that it is 'most likely' to represent the deconvolved EB image. A variety of constraints and additional criteria may be imposed when determining the solution(s) to this problem in order to find a unique answer(s). For example, input 510 may be that which has the smallest value of the cost function (H).

Note that electro-optical path 512 may be different than electro-optical path 412 (FIG. 4). In general, information about electro-optical paths 412 (FIG. 4) and/or 512 may include some or all of the aspects of the EB system, such as: illumination settings, the electromagnetics of the EB system, the electro-optical focusing, etc.

The calculations corresponding to one or more electro-optical paths in forward electro-optical calculation 400 (FIG. 4) and/or inverse electro-optical calculation 500 may be implemented using Fourier-optical techniques. Furthermore, electro-optical paths in forward optical calculation 400 and/or inverse electro-optical calculation 500 may include multiple models of electro-optical paths. Also note that while electro-optical path 412 (FIG. 4) and electro-optical 512 have, respectively, been traversed in a particular direction, these electro-optical paths may be traversed in either direction.

In some embodiments, aspects of forward electro-optical calculation 400 in FIG. 4 (such as the mask pattern) and/or inverse electro-optical calculation 500 are represented using one or more level-set functions. Furthermore, in some embodiments, forward electro-optical calculation 400 and/or inverse electro-optical calculation 500 are divided into a series of overlapping sub-problems (also referred to as 'work units'), at least some of which are processed independently and/or concurrently. These work units may be based on elements or structures (for example, repetitive structures) in the initial EB image.

In some embodiments, during each iteration of inverse electro-optical calculation 500 the level-set function corresponding to input 510 being modified is updated according to $$\phi_{i+1} = \phi_i + \Delta t \cdot \nabla(H),$$

where $\phi_{i+1}$ is an updated version of the level-set function, $\phi_i$ is the current version of the level-set function, $\Delta t$ is a step size in the calculation and $\nabla(H)$ is a gradient or a derivative of the cost function. In an exemplary embodiment, $\nabla(H)$ is $$\left. \frac{\delta H}{\delta \phi} \right|_{\varphi_i},$$

i.e., it is the Frechet derivative of the cost function H. Furthermore, in some embodiments $\nabla(H)$ is the direction of steepest descent for minimizing or optimizing H by changing $\phi$. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of inverse electro-optical calculation 500. In particular, the cost function H may be allowed to increase during some steps as the calculation evolves. In this way, the global minimum in the multi-dimensional space may be determined. Note that the size of this multi-dimensional space may be a number of quantization levels to the power of the number of pixels in the modified mask pattern. In an exemplary embodiment, the EB image has at least 1 million pixels (for example, 1024×1024).

In one embodiment, in any iteration of inverse electro-optical calculation 500, changes in $\phi$ that decrease or increase the cost function (H) up to 0.5% are performed. If a larger change will result (e.g., $\Delta H > 0.5\%$), the step size $\Delta t$ may be decreased by a factor that is at least greater than 1 and the change in $\phi$ is implemented (or not) based on a probability and a value P given by $$e^{\frac{-kH_{i+1}}{H_i}},$$

where $H_{i+1}$ is the cost function in the $i+1^{th}$ iteration (if the change in $\phi$ is implemented) and $H_i$ is the cost function in $i^{th}$ iteration (note that the ratio of $H_{i+1}/H_i$ equals $1+\Delta H$). In some embodiments k is 0.155. For example, if the value P is 0.3 and the probability is a random (or pseudorandom) number between 0 and 1 that is less than P, the cost function may be increased before proceeding. In this way, inverse electro-optical calculation 500 initially takes large steps and thereby explores the solution space.

In some embodiments, inverse electro-optical calculation 500 is run for 100, 1000 or 10,000 iterations at which point the optimal solution has been determined. In other embodiments, the calculation is stopped based on convergence criteria, such as oscillatory behavior, a relative and/or absolute difference between the forward projection of the modified EB image and the initial EB image, the latest change to the cost function H, and/or the history of changes to the cost function H. For example, the relative difference may be less than 1% and/or the absolute difference may be 10 nm for a critical dimension of 100 nm. Note that in some embodiments, the level-set function is re-distanced (i.e., restored to one having a distance function property relative to an edge or contour in the target pattern) at intermediate iterations during inverse electro-optical calculation 500. In an exemplary embodiment, such re-distancing occurs at least every 20 iterations (for example, every 14 iterations).

Figure 6:
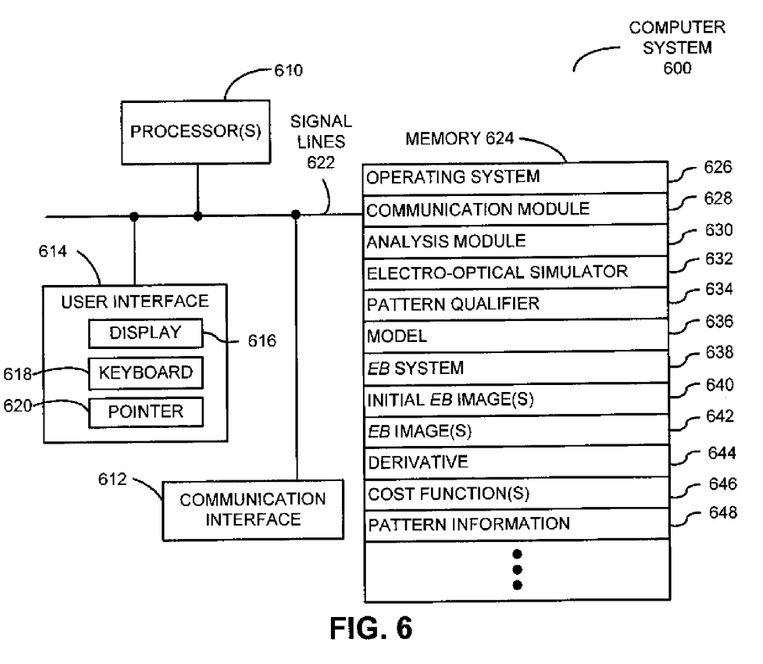
FIG. 6 is a block diagram illustrating a computer system in accordance with an embodiment of the present invention.

We now discuss computer systems for implementing the reconstruction technique. FIG. 6 presents a block diagram illustrating a computer system 600. Computer system 600 includes one or more processors 610, a communication interface 612, a user interface 614, and one or more signal lines 622 coupling these components together. Note that the one or more processing units 610 may support parallel processing and/or multi-threaded operation, the communication interface 612 may have a persistent communication connection, and the one or more signal lines 622 may constitute a communication bus. Moreover, the user interface 614 may include a display 616, a keyboard 618, and/or a pointer 620, such as a mouse.

Memory 624 in the computer system 600 may include volatile memory and/or non-volatile memory. More specifically, memory 624 may include ROM, RAM, EPROM, EEPROM, flash, one or more smart cards, one or more magnetic disc storage devices, and/or one or more optical storage devices. Memory 624 may store an operating system 626 that includes procedures (or a set of instructions) for handling various basic system services for performing hardware dependent tasks. The memory 624 may also store procedures (or a set of instructions) in a communication module 628. The communication procedures may be used for communicating with one or more computers and/or servers, including computers and/or servers that are remotely located with respect to the computer system 600.

Memory 624 may also include multiple program modules (or a set of instructions), including: analysis module 630 (or a set of instructions), electro-optical simulator 632 (or a set of instructions), and/or pattern qualifier 634 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application, such as photo-mask inspection software and/or software in a photo-mask repair system.

During operation of computer system 600, analysis module 630 may deconvolve a model 636 of an electro-optical path in an EB system 638 from one or more initial EB images 640, which results in one or more EB images 642. This deconvolution calculation may involve forward electro-optical calculations and/or inverse electro-optical calculations. Furthermore, a given electro-optical calculation may be performed by electro-optical simulator 632. Additionally, derivative 644 of model 636 may be defined, and one or more cost functions 646 may be determined during operations or steps in the deconvolution calculation. In some embodiments, pattern qualifier 634 extracts pattern information 648 (such as a mask-pattern contour or a critical dimension) from the one or more EB images 642, and this information is used to qualify a photo-mask or a wafer.

Instructions in the various modules in memory 624 may be implemented in a high-level procedural language, an object-oriented programming language, and/or in an assembly or machine language. The programming language may be compiled or interpreted, i.e, configurable or configured to be executed, by the one or more processing units 610.

In some embodiments, at least some of the information in memory 624 is encrypted. Furthermore, information 'stored' in memory 624 in FIG. 6 may be stored locally and/or at remote locations.

Although the computer system 600 is illustrated as having a number of discrete items, FIG. 6 is intended to be a functional description of the various features that may be present in the computer system 600 rather than as a structural schematic of the embodiments described herein. In practice, and as recognized by those of ordinary skill in the art, the functions of the computer system 600 may be distributed over a large number of servers or computers, with various groups of the servers or computers performing particular subsets of the functions. In some embodiments, some or all of the functionality of the computer system 600 may be implemented in one or more ASICs, one or more field programmable gate arrays (FPGAs), and/or one or more digital signal processors (DSPs). In some embodiments the functionality of the computer system 600 may be implemented more in hardware and less in software, or less in hardware and more in software, as is known in the art.

In the preceding discussion, a 'computer system' may include a variety of devices, such as: a personal computer, a laptop computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

In some embodiments, computer system 600 includes fewer or additional components. Furthermore, in these embodiments two or more components may be combined into a single component and/or a position of one or more components may be changed.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for calculating an image, the method comprising:
receiving a first electron-beam (EB) image of a pattern, wherein the first EB image is associated with an EB system;
generating a multi-valued representation of the first EB image; and
calculating, using the computer, a second EB image based on the multi-valued representation of the first EB image and a model of an electro-optical transfer function associated with the EB system, wherein the second EB image is calculated using an inverse calculation in which the multi-valued representation of the first EB image is at an image plane in the model of the electro-optical transfer function and the second EB image is at an object plane in the model of the electro-optical transfer function; and
wherein the inverse calculation restores edges in the first EB image.

2. The method of claim 1, wherein the multi-valued representation of the first EB image includes a level-set function.

3. The method of claim 1, wherein the inverse calculation deconvolves the electro-optical transfer function from the multi-valued representation of the first EB image, thereby filtering noise.

4. The method of claim 1, wherein the model of the electro-optical transfer function has an analytical derivative.

5. The method of claim 4, wherein the analytical derivative is represented by a closed-form expression.

6. The method of claim 1, wherein the model of the electro-optical transfer function corresponds to an EB-size distribution, a secondary-electron bulk-generation distribution, a distribution associated with shadowing effects in the pattern, a background EB intensity and a foreground EB intensity.

7. The method of claim 6, wherein the model of the electro-optical transfer function further corresponds to an overshoot amplitude and an undershoot amplitude.

8. The method of claim 1, wherein the pattern includes one of: a photo-mask and a wafer pattern.

9. The method of claim 1, wherein the method further comprises rendering a third EB image based on the second EB image.

10. The method of claim 1, wherein the pattern corresponds to a target pattern; and
wherein the second EB image is further based on the target pattern.

11. The method of claim 1, wherein the method further comprises identifying a feature in the second EB image.

12. The method of claim 11, wherein the feature includes a critical dimension in the pattern.

13. The method of claim 12, wherein the pattern corresponds to a target pattern; and
wherein the feature corresponds to a difference between the pattern and the target pattern.

14. The method of claim 11, wherein the method further comprises determining an acceptance condition of the pattern in accordance with the feature.

15. A computer-program product for use in conjunction with a computer system, the computer-program product comprising a computer-readable storage medium and a computer-program mechanism embedded therein to calculate an image, the computer-program mechanism including:

instructions for receiving a first EB image of a pattern, wherein the first EB image is associated with an EB system;

instructions for generating a multi-valued representation of the first EB image; and instructions for calculating a second EB image based on the multi-valued representation of the first EB image and a model of an electro-optical transfer function associated with the EB system, wherein the second EB image is calculated using an inverse calculation in which the multi-valued representation of the first EB image is at an image plane in the model of the electro-optical transfer function and the second EB image is at an object plane in the model of the electro-optical transfer function; and wherein the inverse calculation restores edges in the first EB image.

16. The computer-program product of claim 15, wherein the inverse calculation deconvolves the electro-optical transfer function from the multi-valued representation of the first EB image, thereby filtering noise.

17. The computer-program product of claim 15, wherein the model of the electro-optical transfer function has an analytical derivative.

18. The computer-program product of claim 15, wherein the pattern corresponds to a target pattern; and wherein the second EB image is further based on the target pattern.

19. The computer-program product of claim 15, wherein the computer-program mechanism includes instructions for identifying a feature in the second EB image.

20. A computer system, comprising:

at least one processor;

at least one memory; and at least one program module, the program module stored in the memory and configured to be executed by the processor to calculate an image, the program module including:

instructions for receiving a first EB image of a pattern, wherein the first EB image is associated with an EB system;

instructions for generating a multi-valued representation of the first EB image; and instructions for calculating a second EB image based on the multi-valued representation of the first EB image and a model of an electro-optical transfer function associated with the EB system, wherein the second EB image is calculated using an inverse calculation in which the multi-valued representation of the first EB image is at an image plane in the model of the electro-optical transfer function and the second EB image is at an object plane in the model of the electro-optical transfer function; and wherein the inverse calculation restores edges in the first EB image.

* * * * *